(12) United States Patent
Hanssen et al.

(10) Patent No.: US 9,823,734 B2
(45) Date of Patent: Nov. 21, 2017

(54) INSTRUMENTING SWITCH MODE POWER SUPPLY TO MEASURE CIRCUIT POWER CONSUMPTION

(71) Applicant: Atmel Corporation, San Jose, CA (US)

(72) Inventors: Ingar Hanssen, Trondheim (NO); Frode Milch Pedersen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 522 days.

(21) Appl. No.: 14/462,367

(22) Filed: Aug. 18, 2014

(65) Prior Publication Data

US 2016/0048197 A1    Feb. 18, 2016

(51) Int. Cl.
| | |
|---|---|
| G05F 1/00 | (2006.01) |
| G06F 1/32 | (2006.01) |
| G01R 22/10 | (2006.01) |
| H02M 3/07 | (2006.01) |
| H02M 3/156 | (2006.01) |
| H02M 1/00 | (2006.01) |

(52) U.S. Cl.
CPC ........... *G06F 1/3293* (2013.01); *G01R 22/10* (2013.01); *H02M 3/07* (2013.01); *H02M 3/156* (2013.01); *H02M 2001/0009* (2013.01); *H02M 2001/0012* (2013.01)

(58) Field of Classification Search
CPC .... H02M 3/156; H02M 3/158; H02M 3/1588; H02M 2003/1566; H02M 3/155; H02M 3/07; H02M 2001/0009; G06F 1/3293
USPC ................. 323/271, 282; 713/323; 324/76.39
See application file for complete search history.

(56) References Cited

U.S. PATENT DOCUMENTS

| | | | |
|---|---|---|---|
| 2013/0134959 A1* | 5/2013 | Murakami | H02M 3/1584 323/311 |
| 2015/0137700 A1* | 5/2015 | Evans | H05B 33/0815 315/294 |

\* cited by examiner

*Primary Examiner* — Adolf Berhane
*Assistant Examiner* — Afework Demisse
(74) *Attorney, Agent, or Firm* — Fish & Richardson P.C.

(57) ABSTRACT

A circuit includes a pulse generator coupled to a switch mode power supply. The switch mode power supply includes a switching component configured for transferring a charge to an energy storage component in response to pulses provided by the pulse generator. A pulse counter is coupled to the pulse generator or the switching component and configured to count pulses over a time period and thereby generate a pulse count. A converter coupled to the pulse counter is configured to generate a power measurement for the time period based on the pulse count. If the switch mode power supply has different modes of operation, a different counter may be used for each mode.

28 Claims, 6 Drawing Sheets

INSTRUMENTING SWITCH MODE POWER SUPPLY TO MEASURE CIRCUIT POWER CONSUMPTION

TECHNICAL FIELD

This disclosure relates generally to power consumption measurements.

BACKGROUND

Consumers continue to demand more functionality and higher performance in their battery-operated products, such as smart phones and electronic tablet computers. To maximize functionality and battery life, developers of these battery-powered applications must consider several factors in their system design. In these applications, the microcontroller is a primary power consumer and developers must carefully consider the way energy is used. In some cases, developers may need to measure ultra-low power consumption of the microcontroller while in sleep mode. Traditional solutions for measuring power consumption use external current measuring circuitry. It is difficult, however, to design measuring circuitry that can measure in the nanoamp (nA) range.

SUMMARY

This specification discloses generally circuits, methods and systems for instrumenting switch mode power supplies to measure circuit power consumption.

In some implementations, a circuit includes a pulse generator coupled to a switch mode power supply. The switch mode power supply includes a switching component configured for transferring a charge to an energy storage component in response to pulses provided by the pulse generator. A pulse counter is coupled to the pulse generator or the switching component and configured to count pulses over a time period to thereby generate a pulse count. A converter coupled to the pulse counter is configured to generate a power measurement for the time period based on the pulse count.

In some implementations, a system includes a pulse generator coupled to a switch mode power supply. The switch mode power supply includes a switching component configured to transfer a charge to an energy storage component in response to pulses provided by the pulse generator. A pulse counter coupled to the pulse generator or the switching component is configured to count pulses over a time period to thereby generate a pulse count. A central processing unit is operable in response to executing a set of stored instructions to access one or more registers storing the pulse count over a system bus, to determine a system power consumption from the pulse count and initiate a system power consumption reduction.

In some implementations, a method of measuring power consumption comprises: generating, by a pulse generator, pulses for operating a switching component in a switch mode power supply of a circuit; in response to the pulses, transferring a charge to an energy storage component of the circuit; counting, by a pulse counter, the pulses over a period of time to thereby generate a pulse count; and generating a power measurement for the time period based on the pulse count.

Other implementations disclosed herein are directed to methods, circuits and systems.

DETAILED DESCRIPTION

Figure 1:
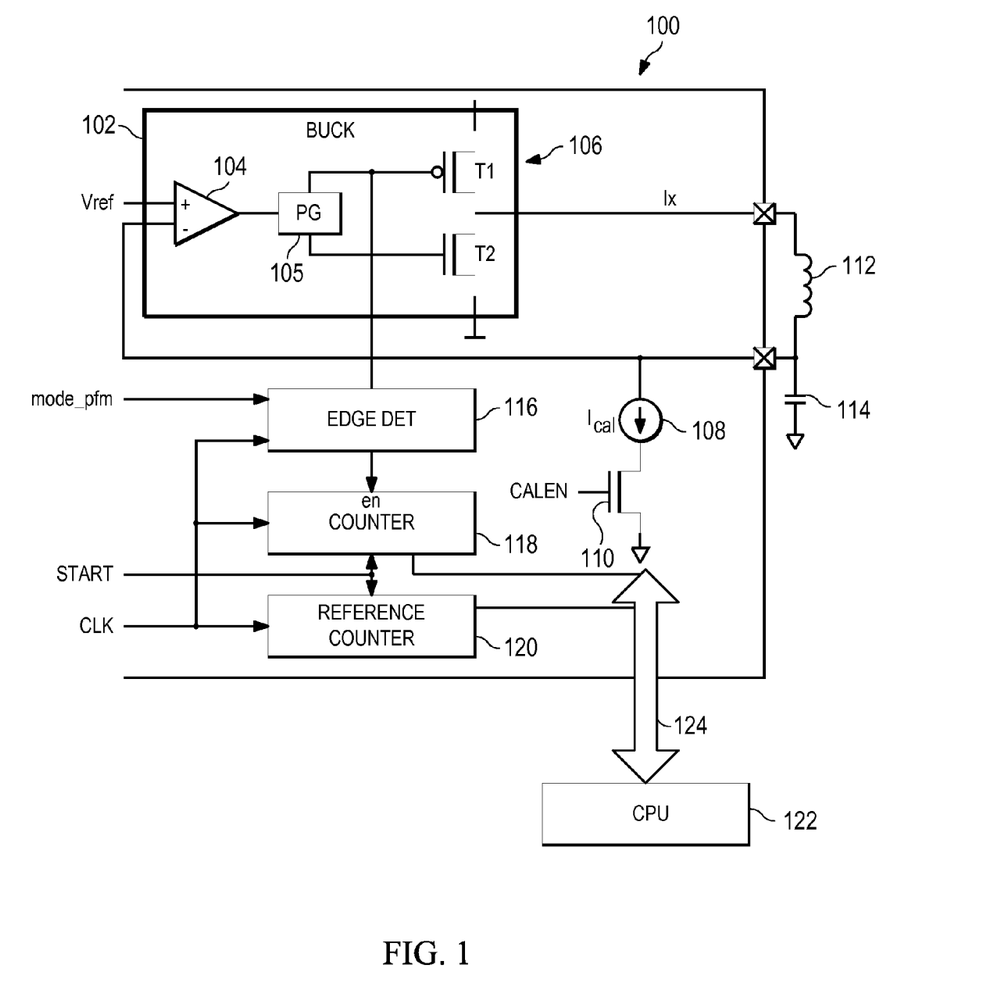
FIG. 1 is a circuit diagram of an example power measurement system including a Buck converter with instrumentation operating in pulse frequency modulation mode.

FIG. 1 is a circuit diagram of an example power measurement system 100 including a switch mode power supply operating in pulse frequency modulation (PFM) mode. In the example shown, the switch mode power supply includes "Buck" power converter 102, including comparator 104, pulse generator (PG) 105, transistor pair 106 (T1, T2), current sink 108, switch 110, energy storage component 112 and output capacitor 114. Instrumentation coupled to power converter 102 includes edge detector 116, pulse counter 118 and reference counter 120. Several components have been omitted from system 100 (e.g., fault circuitry) for clarity.

During operation, power converter 102 performs DC-DC conversion and supplies current to energy storage component 112 (e.g., an inductor) when switching component T1 (e.g., a MOSFET) is closed. Switching component T1 is opened and closed in response to a drive signal (e.g., a pulse train) generated by PG 105. Comparator 104 compares voltage across output capacitor 114 with reference voltage Vref. Based on a result of the comparing, PG 105 opens or closes switching component T1. Output capacitor 114 is charged by the current flowing through energy storage component 112 when switching component T1 is closed and maintains a substantially, constant output voltage Vout when switching component T1 is open. Diode T2 can be a transistor configured as a recirculation diode to re-circulate the current flowing through energy storage element 112 when switching component T1 is open. Current sink 108 is enabled by switch 110 in response to calibration enable signal (CALEN), as described in further detail below.

In the example shown, switching component T1 can be instrumented by coupling switching component T1 to edge detector 116. Edge detector 116 can be enabled by a mode_pfm signal when power converter 102 is operating in PFM mode. Edge detector 116 detects a rising edge of the drive signal (e.g., rising edge of a pulse) applied to switching component T1 by PG 105. Edge detector 116 also receives a clock input signal (CLK). Edge detector 116 synchronizes the drive signal to CLK and produces an enabling pulse on the rising edge of the drive signal pulse. Pulse counter 118 is coupled to the output of edge detector 116 and counts a pulse for each enabling pulse received from edge detector 116. Pulse counter 118 counts up when the drive signal is high (when in PWM mode described below) or has a rising edge (when in PFM mode described below), depending on the configuration of edge detector 116. Reference counter 120 is a fixed frequency counter and is coupled to CLK. Reference counter 120 counts up at a fixed rate. A measurement start signal (START) is coupled to pulse counter 118 and reference counter 120 to synchronize the start and stop of counters 118, 120. Edge detector 116 and counters 118, 120 can belong to the same clock domain and can be reset asynchronously when read by, for example, a central processing unit (CPU) or debugger.

In some implementations, power measurement system 100 can be part of another, larger system (e.g., a microcontroller system or system-on-chip (SoC)). In such a system, counters 118, 120 can be accessed by central processing unit (CPU) 122 through system bus 124 to provide applications with pulse counts to determine power consumption and implement a power consumption reduction strategy, such as temporarily disabling one or more system modules and/or reducing clock frequencies of system clocks. In some implementations, CPU 122 is operable to execute a set of instructions to generate power measurements over a time period based on pulse counts, as described in further detail below.

Example Pulse Frequency Modulation (PFM) Mode Operation

In some implementations, the switching frequency of the switch mode power supply shown in FIG. 1 operating in PFM mode (fixed on-pulse length and variable time between pulses) is dependent on the average current flowing out of switching component T1. By measuring the number of drive pulses over a fixed period of time the average current and thereby the energy consumed can be calculated for the time period. The instrumentation can be implemented as shown in FIG. 1 using pulse counter 118 to count the number of drive pulses. When the mode_pfm enable signal is high, edge detector 116 is enabled to detect the rising edge of a drive pulse. Pulse counter 118 can increment by one for every rising drive pulse.

Reference counter 120 determines the time period when pulse counter 118 is read. The pulse count can be accumulated in a register so that an average count can be calculated over multiple measurement time periods. In some implementations, storage device (e.g., a trace buffer) can be used to store pulse counts if, for example, a power versus time recording is needed. In a practical system, the instrumentation can be implemented using a low-power, general purpose timer/counter module (T/C) or a dedicated set of counters to count drive pulses and a real time counter (RTC) to provide the measurement time period. In some implementations, an external device such as a personal computer can be used to poll the counters and process the results. In some implementations, a signal can be output to an I/O pin that is a $2^N$ division of the input frequency.

Example Pulse Width Modulation (PWM) Mode Operation

If power converter 102 operates in PWM mode, the frequency is constant, while the pulse width varies proportionally with the load. In PWM mode, the mode_pfm signal is low, and there is no edge detection on the drive signal; only synchronization to the counter clock domain (synchronized to CLK). Pulse counter 118 will increment while the drive pulse is high. Reference counter 120 will increment every clock cycle. After one full PWM period, the ratio of the count of pulse counter 118 to the count of reference counter 120 will be equal to the PWM duty percentage. Measuring arbitrarily over multiple PWM periods will result in a ratio that averages to the same duty percentage.

Figure 2:
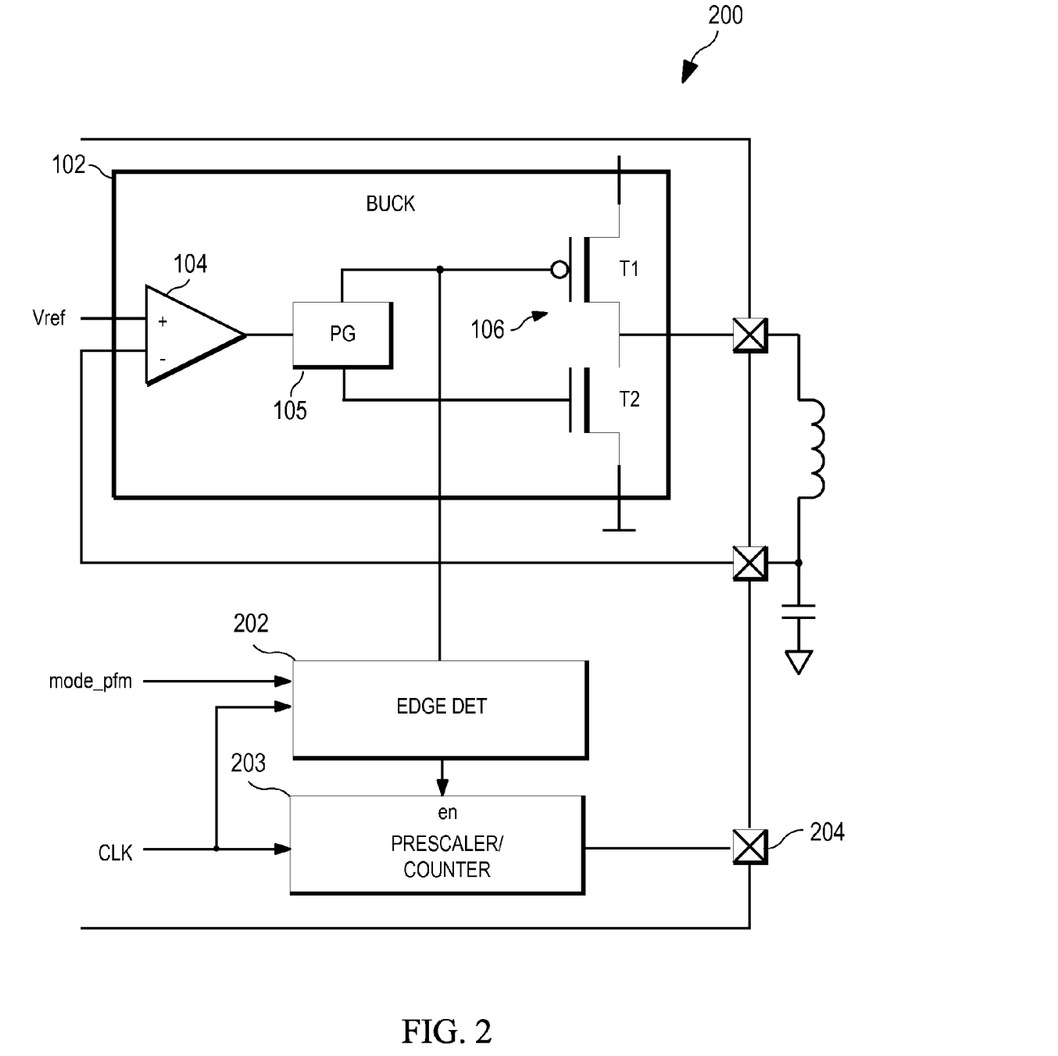
FIG. 2 is circuit diagram of an example power measurement system including a Buck converter with instrumentation while operating in PFM mode using a power trace pin.

FIG. 2 is circuit diagram of power converter 102 with instrumentation while operating in PFM or PWM mode and using a power trace pin to provide a pulse count. In the example shown, edge detector 202 detects the rise of a drive pulse when enabled by mode_pfm and prescaler/counter module 203 is configured to provide a pre-scaled power trace signal on power trace pin 204. Prescaler/counter module 203 will divide the frequency of switching component T1 by, for example, $2^N$. External equipment will more easily track the signal as the frequency is lower. In the configuration shown, the pulse counter (e.g., pulse counter 118) and the reference counter (e.g., reference counter 120) will be inside the external probe receiving the Vout signal. In PFM mode, each pulse on switching component T1 corresponds to a given amount of energy. The pulse count can be used to calculate the total energy consumption of the system. In PWM mode, edge detector 202 is bypassed and the energy for each pulse depends on the width of the pulse. Since the width of each pulse describes the energy one can measure the width of the pulses by counting the number of clock pulses from CLK that have occurred while the PWM drive signal is high. In this way, each count will correspond to a given amount of energy.

In PFM mode, the gate frequency of switching component T1 (e.g., MOSFET) is proportional to the load and it is possible to provide the gate signal from switching component T1 directly onto a pad. Depending on the switching frequency, pad properties, electromagnetic interference and external circuitry it may be more convenient to observe a frequency reduced version of the signal using prescaler/counter module 202.

Example Switched Capacitor Voltage Regulator Operation

Figure 3:
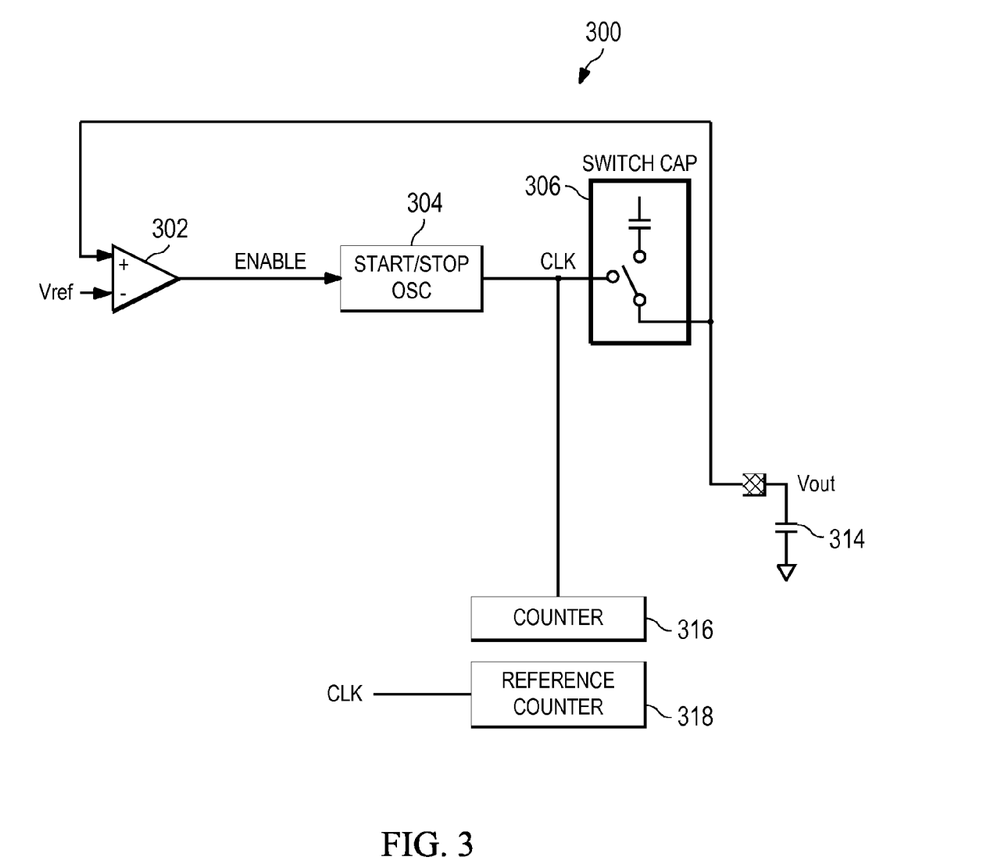
FIG. 3 is a circuit diagram of an example power measurement system including a switched capacitor voltage regulator with minimal instrumentation.

FIG. 3 is a circuit diagram of an example power measurement system 300 including a switched capacitor voltage regulator with minimal instrumentation. In a switched capacitor voltage regulator, the energy transfer through the regulator is also dependent on the number of drive pulses, which means that for a fixed capacitor size and input voltage the output power will be a function of the number of pulses per time unit. Accordingly, the same measurement methods used for power converter 102 in PFM mode can also be used for the switched capacitor voltage regulator. A minimal instrumentation (counters 316, 318) for measuring power consumption is shown in FIG. 3.

In operation, comparator 302 compares the output voltage Vout with a reference voltage Vref and generates an enable signal based on the comparing. The enable signal enables start/stop oscillator 304 for generating CLK for driving a switch in switched capacitor 306. Output capacitor 314 maintains a substantially constant output voltage Vout for a load. Pulse counter 316 counts pulses to switched capacitor 306 and reference counter 318 counts CLK pulses.

Figure 4:
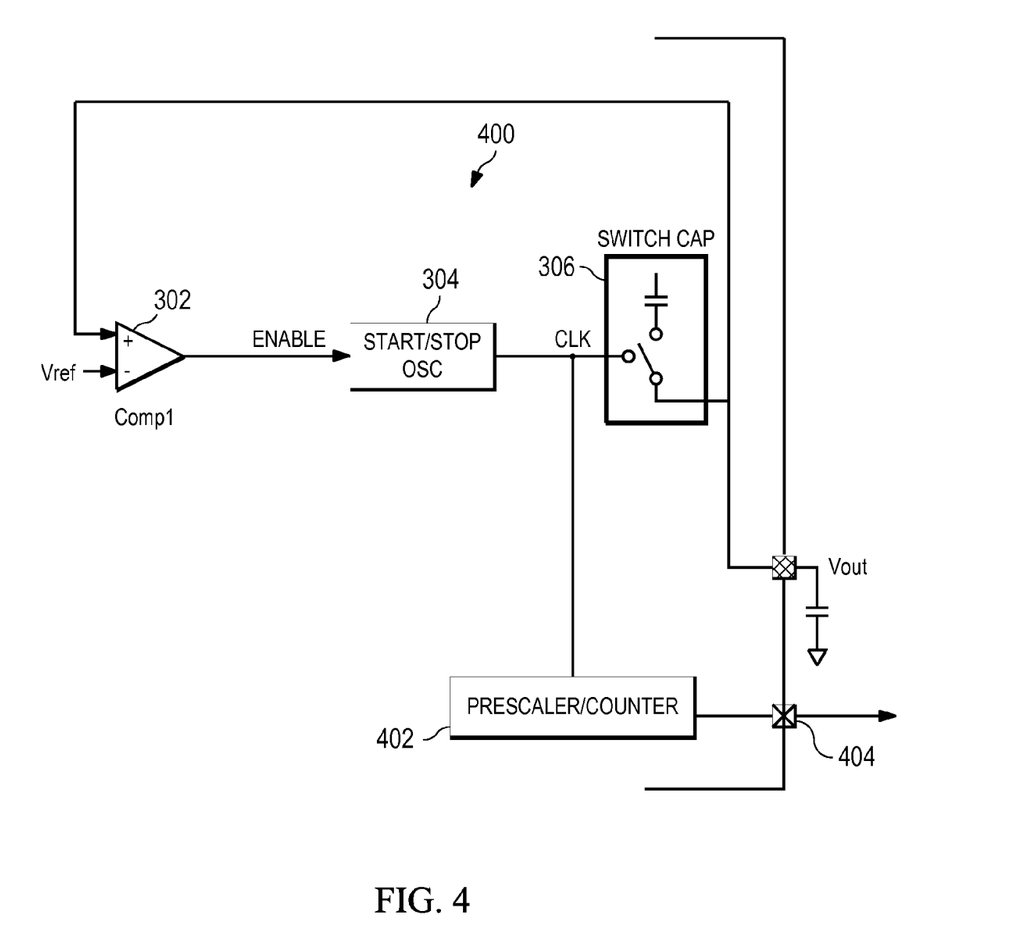
FIG. 4 is a circuit diagram of an example power management system including a switched capacitor voltage regulator with minimal instrumentation using a power trace pin.

FIG. 4 is a circuit diagram of an example power management system 400 including a switched capacitor voltage regulator with minimal instrumentation using a power trace pin. In the example shown, prescaler/counter module 402 is configured to provide a pre-scaled power trace signal on power trace pin 404. Prescaler/counter module 402 is configured to divide the frequency of the switcher with typically $2^N$. As previously described in reference to FIG. 2, it may be more convenient to observe a frequency reduced version of the signal using prescaler/counter module 402.

Figure 5:
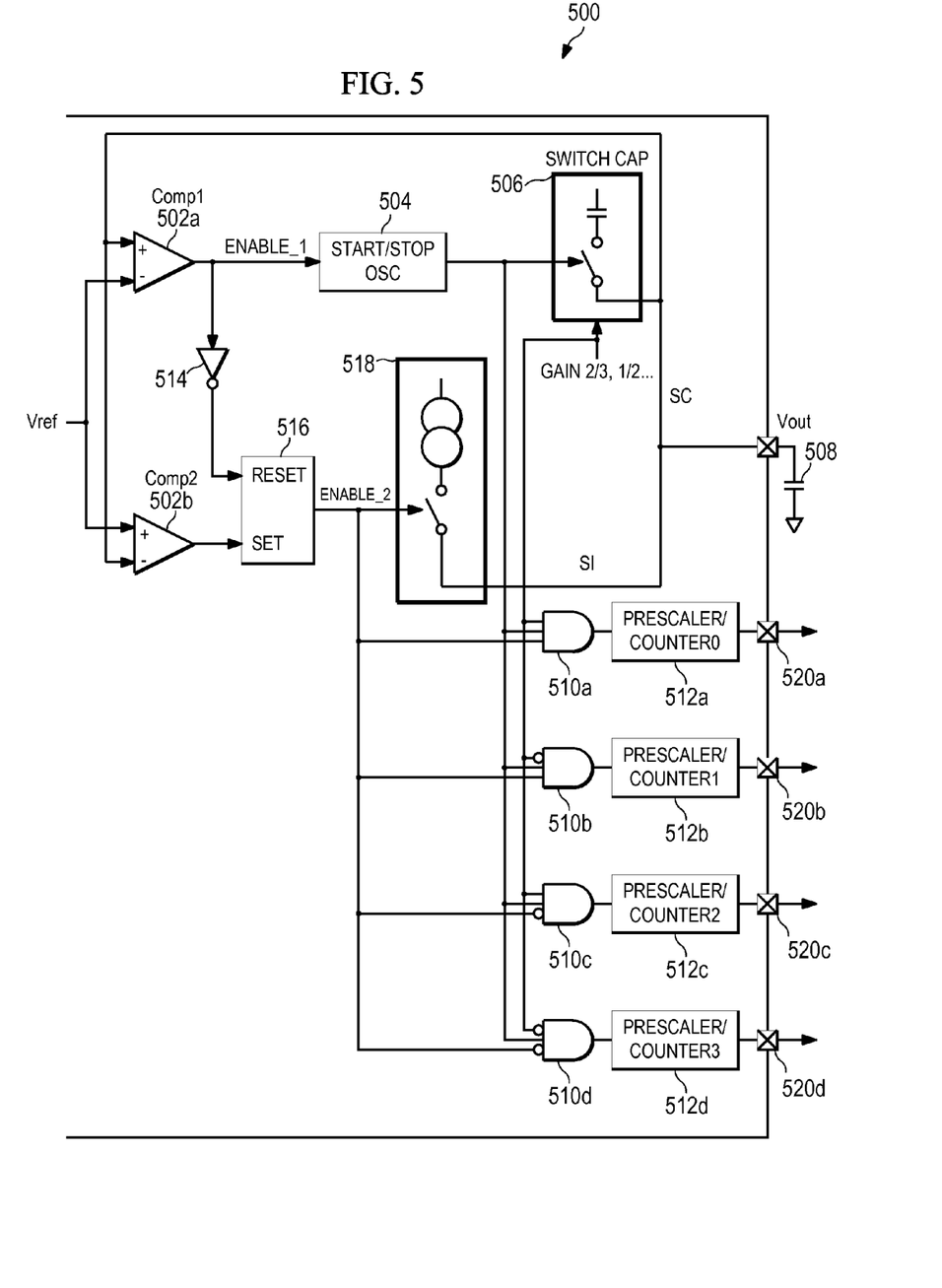
FIG. 5 is a circuit diagram of an example power measurement system including switched capacitor voltage regulator with full-scale instrumentation.

FIG. 5 is a circuit diagram of an example power management system 500 including a switched capacitor voltage regulator with full-scale instrumentation. FIG. 5 illustrates the different modes of the switched capacitor voltage regulator and how the modes are automatically switched.

In some implementations, system 500 includes comparators 502a, 502b, start/stop oscillator 504, switched capacitor 506, output capacitor 508, AND gates 510a-510d, prescaler/counter modules 512a-512d, inverter 514, latch 516 and switched current source 518. Several components have been omitted from system 500 for clarity. Each of AND gates 510a-510d have inputs coupled to CLK, ENABLE_2 and GAIN signals. The outputs of AND gates 510a-510d are coupled to prescaler/counter modules 512a-512d, respectively. Each of prescaler/counter modules 512a-512d is configured to provide pre-scaled power trace signals on power trace pins 520a-520d. Prescaler/counter module 512a is associated with a switched capacitor voltage regulator with ½ gain, prescaler/counter module 512b is associated with a switched capacitor voltage regulator with ⅔ gain, prescaler/counter module 512c is associated with a switched capacitor voltage regulator with ½ gain and prescaler/counter module 512d is associated with a switched capacitor voltage regulator with ⅔ gain.

Comparator 502b (comp 2) compares the output voltage Vout and the reference voltage Vref and generates an output that sets latch 516. When set, latch 516 outputs ENABLE_2 that enables switched current source 518 (e.g., a constant current source) to be coupled to the load. Inverter 514 inverts ENABLE_1 output by comparator 502a to generate a reset signal coupled to a reset input of latch 516 to reset latch 516. Thus, when the outputs of comparators 502a, 502b are high, start/stop oscillator 504 and switched current source 518 are turned on and latch 516 is set. When the outputs of comparators 502a, 502b are low, start/stop oscillator 504 and switched current source 518 are turned off and latch 516 is reset.

In some implementations there can be more than one capacitor value used inside the switched capacitor voltage regulator (this is the gain) for use with different output current ranges. For such configurations, an additional backup method may be used to handle current peaks, which result in a voltage drop below a given limit. This additional backup method can be implemented with switched current source 518 that is enabled in addition to switched capacitor 506. When the voltage is back within the normal limits, switched current source 518 can be turned off again.

As described earlier the energy transferred in each pulse is constant for static configurations where all settings are kept constant. If, however, the gain is changed the energy transferred per pulse can be different. System 500 allows for the gain to change automatically by using separate counters for each mode of operation. For example, in a mode where switched current source 518 is activated an additional constant current ("SI") is added to the output in addition to the switched capacitor current contribution ("SC"). To measure total power consumption, system 500 relies on start/stop oscillator 504 being in constant operation so that it outputs CLK at a constant frequency. By counting the number of pulses of CLK while switched current source 518 is on, the total current consumption (SC+SI) can be measured. In this example, we have 4 circuit configurations which are implemented by AND gates 510a-510d: 1—Gain=⅔; SI OFF; 2—Gain=½; SI OFF; 3—Gain=⅔; SI ON; and 4—Gain=½; SI ON.

Figure 6:
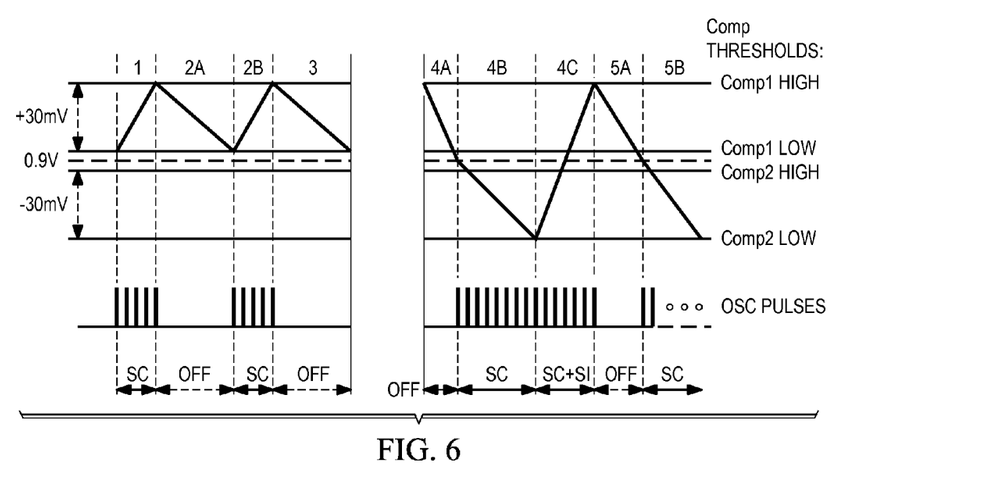
FIG. 6 is a timing diagram of example signals in a switch-capacitor voltage regulator.

FIG. 6 is a timing diagram of example signals in the switch-capacitor voltage regulator shown in FIG. 5. The timing diagram includes 5 phases, which are indicted at the top of the figure to aid the reader. FIG. 6 shows two independent scenarios, which is indicated by discontinuing the graph in the middle of phase 3. Phases 1-3 represent a low power output mode with only switched capacitor 506 in use. Phases 1-3 also apply to FIGS. 3 and 4. Phases 4-5 represent a high power output mode with the switched current source 518 contributing current SI. GAIN is not part of FIG. 6.

In phase 1, comp 1 is high, oscillator 504 is on and Vout increases from 0.9 V (Vref) to (0.9 V+30 mV) where it reaches its high threshold (comp 1 has +30 mV hysteresis). In phase 2A, comp 1 is low, oscillator 504 is off and Vout decreases from (0.9 V+30 mV) down to 0.9 V, at which time phase 2B starts, comp 1 goes high, oscillator 504 is turned on and Vout increases from 0.9 V to (0.9 V+30 mV). In phase 3, comp 1 is low, oscillator 504 is off and Vout decreases from (0.9 V+30 mV) to below 0.9 V.

In phase 4A, comp 1 and comp 2 is low, oscillator 504 is on and Vout decreases to 0.9 V. In phase 4B, comp1 is high and oscillator 504 is on. In phase 4C, Vout has gone down to (0.9 V−30 mV) (comp 2 has −30 mV hysteresis), comp 2 goes high causing the output of latch 516 to be set to high and thereby enabling switched current source 518 (while oscillator 504 is on). Vout increases from (0.9 V−30 mV) to (0.9 V+30 mV). In phase 5A comp 1 is high, oscillator 504 is turned off, latch 516 is reset and thereby switched current source 518 is turned off. Vout decreases from (0.9 V+30 mV) to 0.9. In phase 5B, comp 1 is high and oscillator 504 is on. Vout decreases to (0.9 V−30 mV), at which point the cycle repeats.

Figure 7:
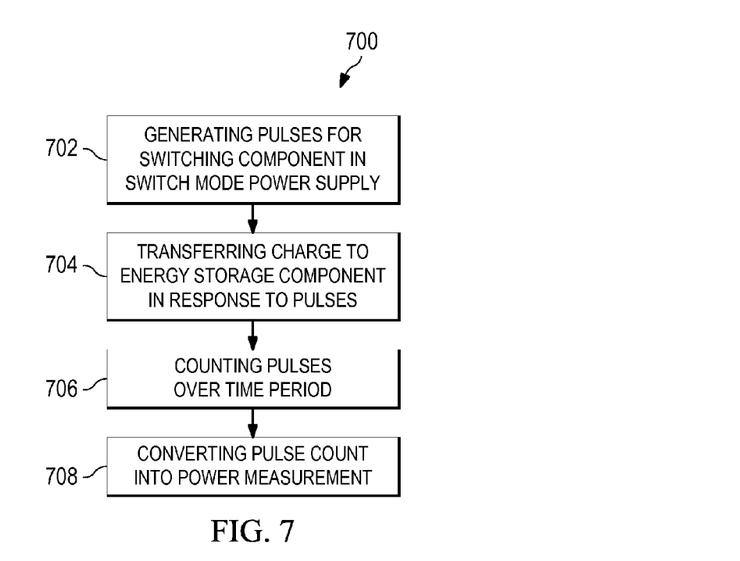
FIG. 7 is a flow diagram of an example process for measuring power consumption of an IC device by monitoring switch mode power supplies.

FIG. 7 is a flow diagram of an example process 700 for measuring power consumption of an IC device by monitoring a switch mode power supply in the IC device. In some lower power systems there are several different power supplies with different capabilities and power profiles and the power controlling unit in the system may automatically switch between the different power supplies or this may be controlled by user programming or configuration. Having individual monitoring of the activity of each power supply enables the user to understand the power profile of an application. In some implementations, the IC device can be a microcontroller unit.

Process 700 can begin by generating pulses for operating a switching component in a switch mode power supply of an integrated circuit device (702). In some implementations, the switch mode power supply can be a power converter (e.g., Buck converter) running in PFM mode. In other implementations, the power converter can be running in PWM mode. The pulses can be square pulses generated by a pulse generator (e.g., an oscillator, PWM module) that can control the pulse frequency (PFM mode) or pulse width (PWM mode) depending on the desired mode of operation. In some implementations, the switch mode power supply can be a switched capacitor voltage regulator. In a switched capacitor voltage regulator a current source (e.g., constant current source) can be used to handle current peaks that result in a voltage drop below a given limit.

Process 700 can continue by, in response to the pulses, transferring charge to an energy storage component (704). For example, a switching component (e.g., a MOSFET) in the switch mode power supply can be configured to open and close in response to the pulses, resulting in charge being transferred to the energy storage component (e.g., an inductor).

Process 700 can continue by counting, by a counter, the pulses over a period of time (706). For power converters running in PFM mode, an edge detector can be included to synchronize the drive signal to a clock and produce an enabling pulse on the rising edge of the drive signal. A pulse counter can be configured to count up when the drive signal is high (PWM mode) or has a rising edge (PFM mode), depending on the configuration of the edge detector. A reference counter can be used to provide the measurement time periods when the pulse counter is read. The number of pulses can be accumulated in a register over multiple measurement time periods so that an average pulse count can be calculated. In some implementations, the pulse count is stored in a storage device (e.g., a trace buffer) if a power versus time recording is needed.

For a power converter running in PWM mode, there is no edge detection only synchronization to the counter clock domain. The pulse counter will increment for as long as the pulse is high. Measuring over multiple cycles and comparing the pulse counter value to the reference counter, will average to the pulse modulation duty cycle, and thus be proportional to the load.

For switched capacitor voltage regulators, the energy transfer through the regulator is also dependent on the number of transfer pulses, which means that for a fixed capacitor size and input voltage the output power will be a function of the number of pulses per time unit. The sum of capacitive energy transfer pulses can be calculated using a counter.

Process 700 can continue by converting the pulse count into a power measurement (708). By counting pulses over a fixed time period an average current and thereby the energy consumed by the device can be calculated for the given time period, as described below.

Example Converting Pulse Counts to Current Value

Referring again to FIG. 1, the ratio of the count of pulse counter 118 and the count of reference counter 120 results in a relative number for the power consumption of the device. This ratio can be converted to an absolute current value by coupling a known load to the output and observing the effect on the power consumption of the device. In the example shown, current sink 108 (Ical) is a known load that is enabled by the signal CALEN. In normal operation, calen is held low, ensuring no added current consumption. In calibration mode, calen is held high, switch 110 is turned on and current sink 108 is coupled to the load. The circuit configuration shown in FIG.1 can be used to measure the device power consumption in normal mode and calibration mode. The difference in power consumption between the normal and calibration modes is due to the known current sink 108, which allows the relative power number to be converted to the absolute current value. For example, let R0 be the ratio of the counters for a load Ix and R1 be the ratio of the counters for a load (Ix+Ical). Then, the ratio R0:R1=Ix:(Ix+Ical). Thus, Ix=Ical*R0:(R1−R0).

In some implementations, current sink 108 can be implemented as a fixed current sink attached to the output of the switch mode power supply. A lower cost implementation can be achieved by leveraging an existing analog block in the device (e.g., an oscillator), which is powered from the power supply output. Enabling and disabling the analog block results in a difference value in current consumption, which can be characterized during production testing. The difference value can be stored in non-volatile memory of the device, allowing the analog block to be used as the current sink to calibrate the power measurement.

In some implementations, a user can reduce the power consumption by a percentage (e.g., 60%) by introducing a different driver routing in software. Also, finding the optimal power consumption can be done working from non-absolute numbers.

Example Debug Probe

For systems relying on counters with an output coupled to an I/O pin, a power profiling debug probe can be used. This will have counter inputs that can accumulate the output signals from the different regulators. This set of output ports can be viewed as a system power trace port. The debug probe will keep track of the number of pulses from each counter and relay these numbers to analyzing algorithms running on a personal computer or similar processing device. By recording these numbers over time, a power profile of the device can be established and the user will be able to optimize his application code with respect to energy consumption.

Example Power-Aware Applications

In some implementations, the pulse and reference counters described in above can be accessed by a CPU on a system bus in the IC device. An application can be designed to be self-aware of its own power consumption, which could allow the application to switch between different strategies to reduce power consumption, such as temporarily disabling one or more modules or reducing clock frequencies.

Particular implementations of instrumenting switch mode power supplies to measure total power consumption of ICs provide one or more of the following advantages. An external debug system can use the instrumented switch mode voltage regulator to build a power profile of the IC, which provides a powerful aid for optimizing the total power consumption of the IC, including power consumption of the IC during ultra-low power sleep mode. An application running on the IC can be designed to be self-aware of its own power consumption, which allows the application to switch between different strategies to reduce power consumption of the IC, such as temporarily disabling modules or reduce clock frequencies.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:
1. A circuit comprising:
a pulse generator configured to generate pulses;

a switch mode power supply coupled to the pulse generator, the switch mode power supply including a switching component configured to transfer a charge to an energy storage component in response to pulses provided by the pulse generator;

an edge detector coupled to the pulse generator, the edge detector configured to detect an edge of each pulse and for generating a signal indicating the presence of each pulse;

a pulse counter coupled to the edge detector and configured to receive the signal and to count the pulses over a time period to thereby generate a pulse count; and a converter coupled to the pulse counter and configured to generate a power measurement for the time period based on the pulse count.

2. The circuit of claim 1, further comprising:
a current sink coupled to an output of the switch mode power supply and configured to add current to the circuit during a calibration sequence.

3. The circuit of claim 1, further comprising:
an analog block included in the circuit and configured to be a current sink during a calibration sequence.

4. The circuit of claim 1, where the switch mode power supply is a power converter configured to operate in pulse frequency modulation mode.

5. The circuit of claim 1, where the switch mode power supply is a power converter configured to operate in pulse width modulation mode.

6. The circuit of claim 1, where the switch mode power supply is a switched capacitor voltage regulator.

7. The circuit of claim 6, further comprising a current source coupled to the switch mode power supply and configured to be enabled when a current peak results in an output voltage of the switch mode power supply drops below a voltage reference.

8. The circuit of claim 7, further comprising:
a switch coupled to the current source and configured to turn the current source on or off;
a latch having an output coupled to the switch and configured to operating the switch; and
a comparator having inputs coupled to the output voltage of the switch mode power supply and the voltage reference and an output coupled to an input of the latch, the comparator configured to enable the latch when the output voltage drops below the voltage reference.

9. The circuit of claim 1, further comprising a reference counter coupled to a clock and configured to count clock pulses to determine the time period.

10. The circuit of claim 1, further comprising a register coupled to the pulse counter and configured to accumulate pulse counts over multiple time periods.

11. The circuit of claim 1, further comprising a storage device coupled to the pulse counter and configured to store pulse counts.

12. A system comprising:
a pulse generator configured to generate pulses;
a switch mode power supply coupled to the pulse generator, the switch mode power supply including a switching component configured to transfer a charge to an energy storage component in response to pulses provided by the pulse generator;
an edge detector coupled to the pulse generator, the edge detector configured to detect an edge of each pulse and for generating a signal indicating the presence of each pulse;
a pulse counter coupled to the edge detector and configured to receive the signal and to count the pulses over a time period to thereby generate a pulse count;
a central processing unit; and
a bus coupled to the central processing unit and one or more registers storing the pulse count, where the central processing unit is operable in response to executing a set of stored instructions to access the pulse count over the system bus, to determine a system power consumption from the pulse count and to initiate a system power consumption reduction.

13. The circuit of claim 12, where initiating the system power consumption reduction includes disabling one or more system modules or reducing a frequency of one or more system clocks.

14. A method of measuring power consumption, the method comprising:
generating, by a pulse generator, pulses for operating a switching component in a switch mode power supply of a circuit;
in response to the pulses, transferring a charge to an energy storage component of the circuit;
detecting, by an edge detector, an edge of each pulse;
generating, by the edge detector, a signal indicating the presence of each pulse;
counting, by a pulse counter coupled to the edge detector and configured to receive the signal, the pulses over a time period of time to thereby generate a pulse count; and
generating a power measurement for the time period based on the pulse count.

15. The method of claim 14, where converting the pulse count into a power measurement includes converting relative power determined from the pulse count to absolute energy by differential calibration using a fixed current source as a load.

16. The method of claim 14, further comprising:
adding current to the circuit by a current sink coupled to an output of the switch mode power supply during a calibration sequence.

17. The method of claim 14, further comprising:
sinking current during a calibration sequence by an analog block included in the circuit.

18. The method of claim 14, where the switch mode power supply is a power converter and the method further comprises configuring the power converter to operate in pulse frequency modulation mode.

19. The method of claim 14, where the switch mode power supply is a power converter and the method further comprises configuring the power converter to operate in pulse width modulation mode.

20. The method of claim 14, where the switch mode power supply is a switched capacitor voltage regulator and the method further comprises configuring the switched capacitor voltage regulator to transfer energy to a capacitive load in response to an oscillator output.

21. The method of claim 20, further comprising:
configuring a constant current source to be enabled when a current peak results in an output voltage drops below a limit.

22. The method of claim 21, further comprising:
configuring a switch coupled to the constant current source to turn the constant current source on or off;
configuring a latch having an output coupled to the switch to operate the switch; and
configuring a comparator having inputs coupled to the output voltage and a reference voltage and an output coupled to an input of the latch, to enable the latch when the output voltage drops below the voltage reference.

23. The method of claim 14, further comprising counting clock pulses by a reference counter to determine the time period.

24. The method of claim 14, further comprising:
detecting, by an edge detector, a rising edge of a pulse and for generating an enable signal indicating presence of a pulse.

25. The method of claim 14, further comprising:
accumulating, by a register, pulse counts over multiple time periods.

26. The method of claim 14, further comprising:
storing pulse counts, by a storage device coupled to a power trace port of the circuit.

27. The method of claim 14, further comprising:
obtaining, by a processor of the circuit, the pulse counts;
determining power consumption of the circuit based on the pulse counts; and
configuring, by the processor, the circuit to implement one of a plurality of power
consumption strategies based on the determined power consumption.

28. The method of claim 27, where configuring the circuit to implement one of a plurality of power consumption strategies includes disabling one or more modules of the circuit or reducing a frequency of one or more clocks on the circuit.

* * * * *

UNITED STATES PATENT AND TRADEMARK OFFICE
CERTIFICATE OF CORRECTION

| | | |
|---|---|---|
| PATENT NO. | : 9,823,734 B2 | |
| APPLICATION NO. | : 14/462367 | |
| DATED | : November 21, 2017 | |
| INVENTOR(S) | : Ingar Hanssen and Frode Milch Pedersen | |

It is certified that error appears in the above-identified patent and that said Letters Patent is hereby corrected as shown below:

In the Specification

Column 6, Line 6, replace "indicted" with -- indicated --.

Signed and Sealed this
Fifth Day of June, 2018

Andrei Iancu
*Director of the United States Patent and Trademark Office*